(12) United States Patent
Ho et al.

(10) Patent No.: US 9,165,890 B2
(45) Date of Patent: Oct. 20, 2015

(54) CHIP PACKAGE COMPRISING ALIGNMENT MARK AND METHOD FOR FORMING THE SAME

(71) Applicant: XINTEC INC., Jhongli, Taoyuan County (TW)

(72) Inventors: Yen-Shih Ho, Kaohsiung (TW); Shih-Chin Chen, Zhubei (TW); Yi-Ming Chang, Pingzhen (TW); Chien-Hui Chen, Zhongli (TW); Chia-Ming Cheng, Taipei (TW); Wei-Luen Suen, New Taipei (TW); Chen-Han Chiang, Luodong Township (TW)

(73) Assignee: XINTEC INC., Taoyuan (TW)

( * ) Notice: Subject to any disclaimer, the term of this patent is extended or adjusted under 35 U.S.C. 154(b) by 0 days.

(21) Appl. No.: 13/941,854

(22) Filed: Jul. 15, 2013

(65) Prior Publication Data

US 2014/0015111 A1    Jan. 16, 2014

Related U.S. Application Data

(60) Provisional application No. 61/672,035, filed on Jul. 16, 2012.

(51) Int. Cl.
*H01L 23/544* (2006.01)
*H01L 23/48* (2006.01)
(Continued)

(52) U.S. Cl.
CPC .............. *H01L 23/544* (2013.01); *H01L 21/78* (2013.01); *H01L 23/3185* (2013.01); *H01L 24/06* (2013.01); *H01L 24/14* (2013.01); *H01L 24/05* (2013.01); *H01L 24/13* (2013.01); *H01L 2223/5442* (2013.01); *H01L 2223/5446* (2013.01); *H01L 2223/54426* (2013.01); *H01L 2223/54453* (2013.01); *H01L 2224/02371* (2013.01); *H01L 2224/02377* (2013.01); *H01L 2224/03462* (2013.01); *H01L 2224/0401* (2013.01); *H01L 2224/05548* (2013.01); *H01L 2224/05554* (2013.01); *H01L 2224/05567* (2013.01); *H01L 2224/05569* (2013.01); *H01L 2224/05624* (2013.01); *H01L 2224/05644* (2013.01); *H01L 2224/05647* (2013.01); *H01L 2224/05669* (2013.01); *H01L 2224/0616* (2013.01); *H01L 2224/06155* (2013.01); *H01L 2224/131* (2013.01); *H01L 2224/13022* (2013.01);

(Continued)

(58) Field of Classification Search
USPC .......... 257/620, 774, 773, 776, 778, 691, 692, 257/786
See application file for complete search history.

(56) References Cited

U.S. PATENT DOCUMENTS

2008/0088221 A1*  4/2008  Chung et al. ............... 313/402
2010/0059823 A1   3/2010  Chung et al.
(Continued)

*Primary Examiner* — Dilinh Nguyen
(74) *Attorney, Agent, or Firm* — Liu & Liu

(57) ABSTRACT

An embodiment of the invention provides a chip package which includes: a semiconductor substrate having a first surface and an opposite second surface; a device region disposed in the substrate; a dielectric layer located on the first surface of the semiconductor substrate; a plurality of conducting pads located in the dielectric layer and electrically connected to the device region; at least one alignment mark disposed in the semiconductor substrate and extending from the second surface towards the first surface.

20 Claims, 11 Drawing Sheets

(51) Int. Cl.
*H01L 23/52* (2006.01)
*H01L 29/40* (2006.01)
*H01L 21/78* (2006.01)
*H01L 23/31* (2006.01)
*H01L 23/00* (2006.01)

(52) U.S. Cl.
CPC ........... *H01L 2224/13024* (2013.01); *H01L 2224/1416* (2013.01); *H01L 2224/14155* (2013.01); *H01L 2224/97* (2013.01); *H01L 2924/00014* (2013.01); *H01L 2924/13091* (2013.01); *H01L 2924/1461* (2013.01); *H01L 2924/15788* (2013.01)

(56) References Cited

U.S. PATENT DOCUMENTS

| | | | |
|---|---|---|---|
| 2010/0237451 | A1 | 9/2010 | Murakoshi |
| 2011/0175221 | A1* | 7/2011 | Ni et al. .................. 257/737 |
| 2013/0069190 | A1* | 3/2013 | Kao et al. ................ 257/432 |

* cited by examiner

CHIP PACKAGE COMPRISING ALIGNMENT MARK AND METHOD FOR FORMING THE SAME

CROSS REFERENCE TO RELATED APPLICATIONS

This Application claims the benefit of U.S. Provisional Application No. 61/672,035, filed on Jul. 16, 2012, the entirety of which is incorporated by reference herein.

BACKGROUND OF THE INVENTION

1. Field of the Invention

The invention relates to a chip package, and in particular relates to a chip package formed by a wafer level packaging process.

2. Description of the Related Art

A fabrication process of chip packages is one important step of forming electronic products. A chip package not only provides protection for the chips from environmental contaminants, but also provides a connection interface for chips packaged therein.

Because the size of the chip is shrinking and the number of pads is increasing, it has become more difficult to form wires which are electrically connected to the pads in the chip package. Also, the accuracy of the dicing process of chips affects the reliability and performance of formed chip packages. Thus, it is desired to have an improved chip packaging technique.

BRIEF SUMMARY OF THE INVENTION

An embodiment of the invention provides a chip package, which includes: a semiconductor substrate having a first surface and a second surface opposite thereto; a device region located in the semiconductor substrate; a dielectric layer disposed on the first surface of the semiconductor substrate; a plurality of conducting pads disposed in the dielectric layer and electrically connected to the device region; and at least one alignment mark disposed in the semiconductor substrate and extending from the second surface toward the first surface.

A method for forming a chip package, which includes: providing a substrate, wherein the substrate is divided into a plurality of die regions by a plurality of predetermined scribing lines, at least one device region is formed in each of the die regions, a dielectric layer is formed on a first surface of the substrate, a plurality of conducting pads are formed in the dielectric layer, and the conducting pads are arranged substantially along the predetermined scribing lines; partially removing the substrate from a second surface of the substrate to form a plurality of alignment marks extending toward the first surface, wherein at least one of the alignment marks is formed in each of the die regions of the substrate; forming an insulating layer on the second surface of the substrate; forming a plurality of wiring layers on the insulating layer, wherein the wiring layers electrically contact the corresponding conducting pads; and by using the alignment marks, performing a dicing process along the predetermined scribing lines to form a plurality of chip packages separated from each other.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1A:
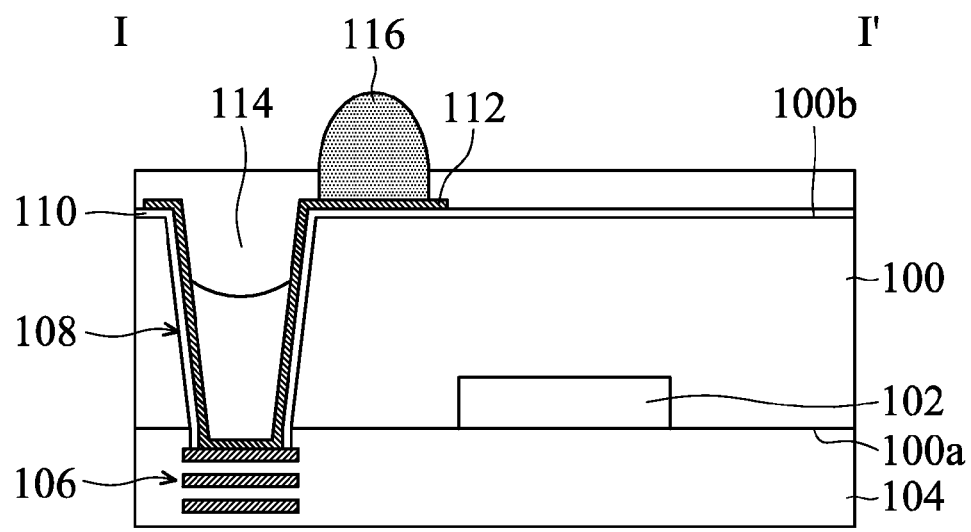
FIG. 1A is a cross-sectional view showing a chip package known by the inventor of the application.

The following description is of the best-contemplated mode of carrying out the invention. This description is made for the purpose of illustrating the general principles of the invention and should not be taken in a limiting sense. The scope of the invention is best determined by reference to the appended claims.

The manufacturing method and method for use of the embodiment of the invention are illustrated in detail as follows. It is understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numbers and/or letters in the various examples. This repetition is for the purpose of simplicity and clarity and does not in itself dictate a relationship between the various embodiments and/or configurations discussed. Furthermore, descriptions of a first layer "on," "overlying," (and like descriptions) a second layer, include embodiments where the first and second layers are in direct contact and those where one or more layers are interposing the first and second layers.

A chip package according to an embodiment of the present invention may be used to package a MOSFET chip such as a power module chip. However, embodiments of the invention are not limited thereto. For example, the chip package of the embodiments of the invention may be applied to package active or passive devices, or electronic components with digital or analog circuits, such as opto electronic devices, micro electro mechanical systems (MEMS), micro fluidic systems, and physical sensors for detecting heat, light, or pressure. Particularly, a wafer scale package (WSP) process may be applied to package semiconductor chips, such as image sensor devices, light-emitting diodes (LEDs), solar cells, RF circuits, accelerators, gyroscopes, micro actuators, surface acoustic wave devices, pressure sensors, ink printer heads, or power ICs.

The wafer scale package process mentioned above mainly means that after the package process is accomplished during the wafer stage, the wafer with chips is cut to obtain separate independent packages. However, in a specific embodiment, separate independent chips may be redistributed overlying a supporting wafer and then be packaged, which may also be referred to as a wafer scale package process. In addition, the above mentioned wafer scale package process may also be adapted to form chip packages of multi-layer integrated circuit devices by stacking a plurality of wafers having integrated circuits. In one embodiment, the diced package is a chip scale package (CSP). The size of the chip scale package (CSP) may only be slightly larger than the size of the packaged chip. For example, the size of the chip package is not larger than 120% of the size of the packaged chip.

Figure 1B:
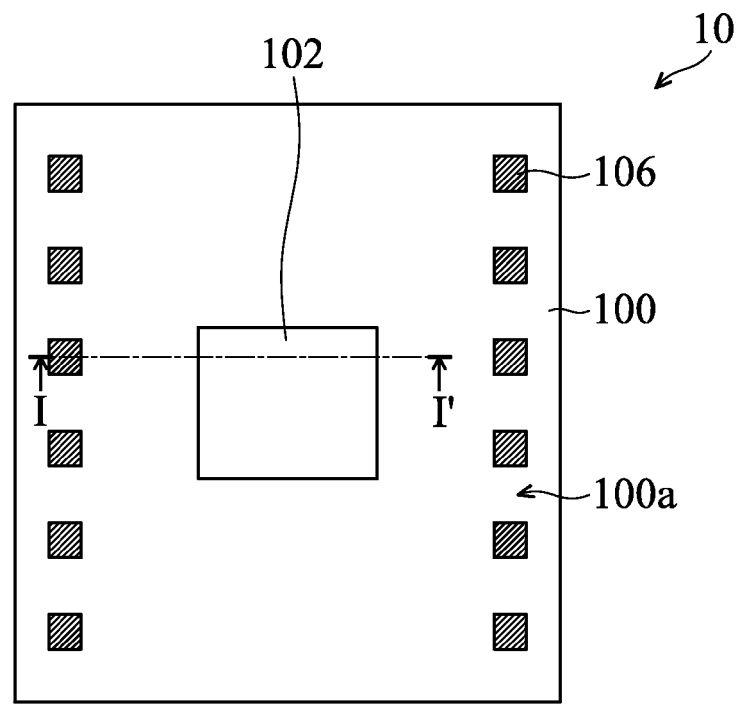
FIG. 1B is a top view showing a chip known by the inventor of the application.

FIG. 1A is a cross-sectional view showing a chip package known by the inventor of the application, and FIG. 1B is a top view showing a chip 10 known by the inventor of the application, which are used to illustrate problems discovered by the inventor. FIG. 1A is a cross-sectional view taken along the line I-I' of FIG. 1B.

As shown in FIG. 1B, the packaged chip 10 includes a substrate 100. A device region 102 is formed in the substrate 100. A plurality of conducting pads 106 are disposed on a surface 100a of the substrate 100, which are electrically connected to elements in the device region 102, respectively. The conducting pads 106 may be disposed on a periphery region of the substrate 100. As shown in the cross-sectional view in FIG. 1A, the conducting pads 106 may be formed in a dielectric layer 104 formed on the surface 100a of the substrate 100. In addition, a plurality of holes 108 extending from a surface 100b towards the surface 100a of the substrate 100 may be formed in the substrate 100. The holes 108 may expose the corresponding conducting pads 106 thereunder, respectively.

As shown in FIG. 1A, an insulating layer 110 may be formed on the surface 100b of the substrate 100, which may extend onto a sidewall of the hole 108. A plurality of wiring layers 112 may be formed on the insulating layer 110 and extend into the holes 108 to electrically contact with the conducting pads 106, respectively and correspondingly. The wiring layers 112 may further be electrically connected to conducting bumps 116 penetrating a protection layer 114.

However, with elements in the device region 102 in the chip 10 becoming denser, the number of the required conducting pads 106 accordingly has increased. In addition, with the size of the chip 10 becoming smaller, the area of each of the conducting pads 106 accordingly has shrunk. The formed holes 108 exposing the conducting pads 106 also need to be shrunk. Thus, the inventor of the application deduced that problems with the patterning process would occur when the hole 108 is shrunk to a specific level. In addition, because the aspect ratio of the hole 108 is increased, it is also becoming more difficult to form a material layer (such as the insulating layer 110 and the conducting layer 112) in the hole 108.

Figure 6:
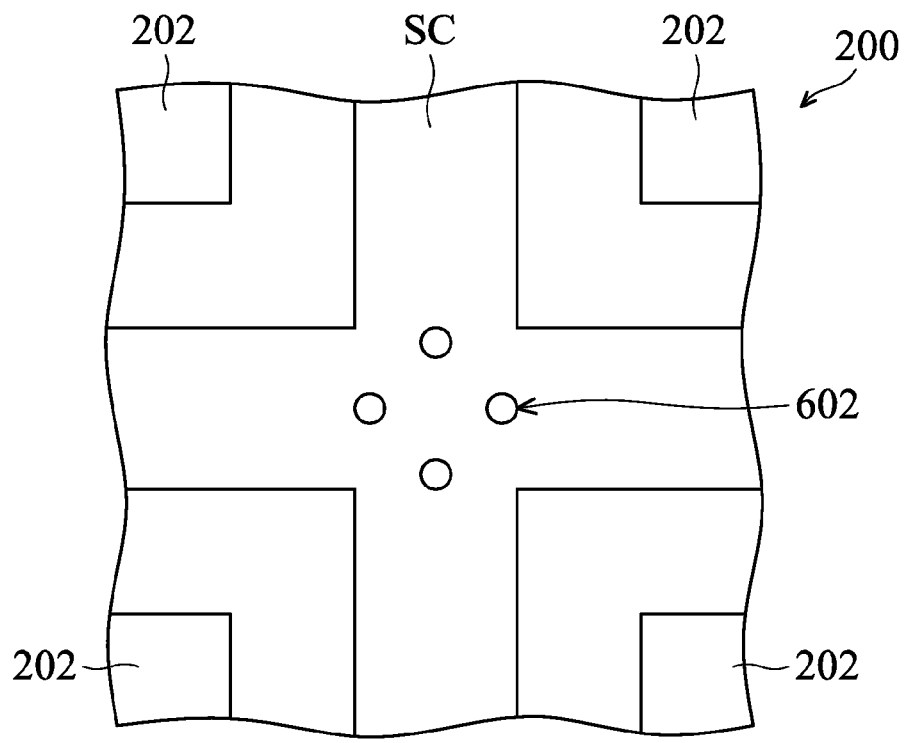
FIG. 6 is a top view of a wafer known by the inventor of the application.

FIG. 6 is a top view of a wafer known by the inventor of the application. As shown in FIG. 6, for accurately and smoothly performing a dicing process along predetermined scribe lines SC of a substrate 200 (such as a wafer), alignment marks 602 may be formed in the portion of the substrate 200 located within the scribe lines SC. The alignment marks 602 may be holes or openings formed in the substrate 200. Since the alignment marks 602 are formed within the predetermined scribe lines SC, the alignment marks 602 are not covered by material layers in the die region, and the alignment marks 602 do not shift after the stacking of the material layers. Thus, based on the alignment marks 602, dicing processes may be performed accurately to prevent the cutting knife from damaging the die region.

However, in some embodiments, recesses passing through the substrate 200 or passing through the substrate 200 and the dielectric layers thereunder need to be formed within the predetermined scribe lines SC, which results in the alignment marks 602, which are formed within the predetermined scribe lines SC, being removed along with the removal of the substrate 200, such that, it is hard to align the dicing process thereafter.

Thus, in order to resolve and/or reduce the problems which might be encountered, an improved chip packaging technique is provided by the inventor. Hereafter, embodiments of the invention are illustrated with reference to the accompanying drawings to introduce the chip packaging technique of the invention.

Figure 2A:
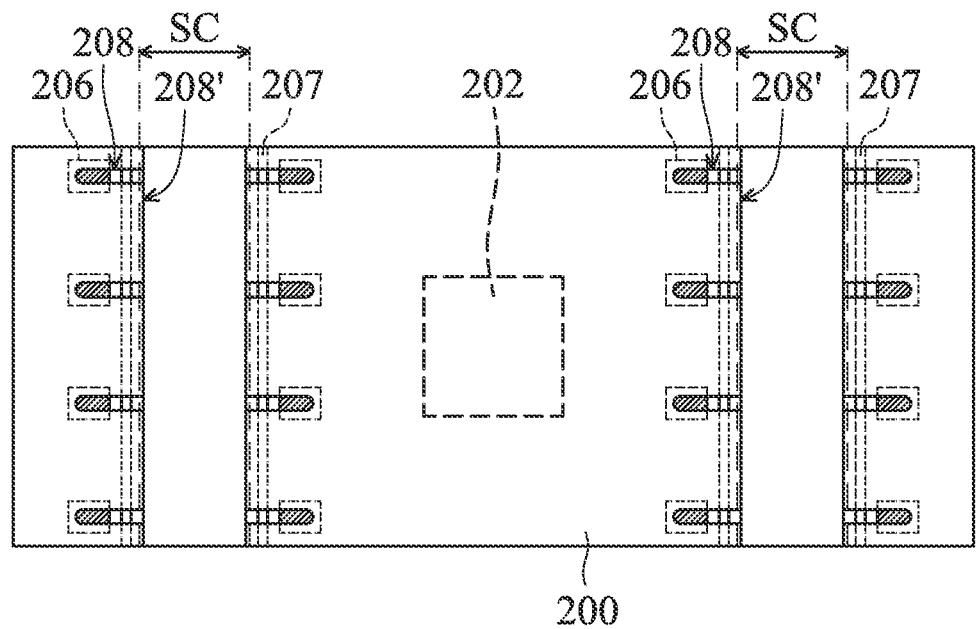
FIGS. 2A-2B are top views of a process of a chip package according to an embodiment of the present invention.
Figure 2B:
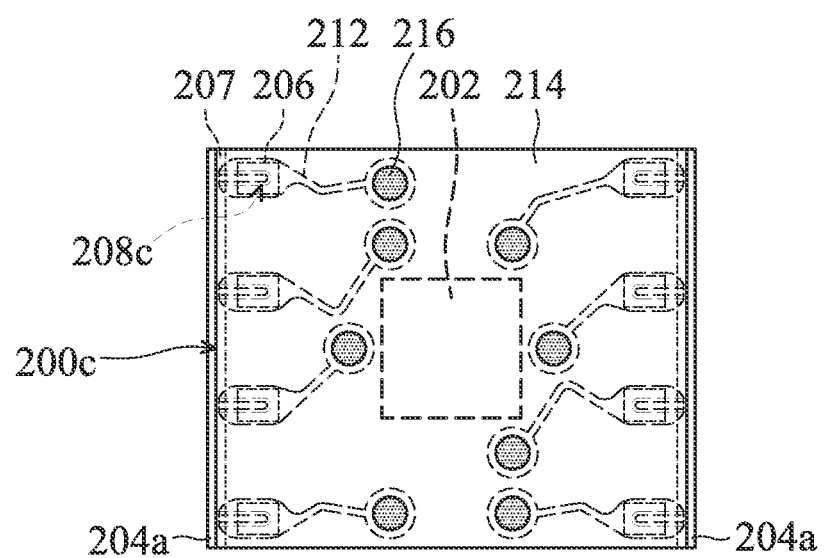
Figure 4A:
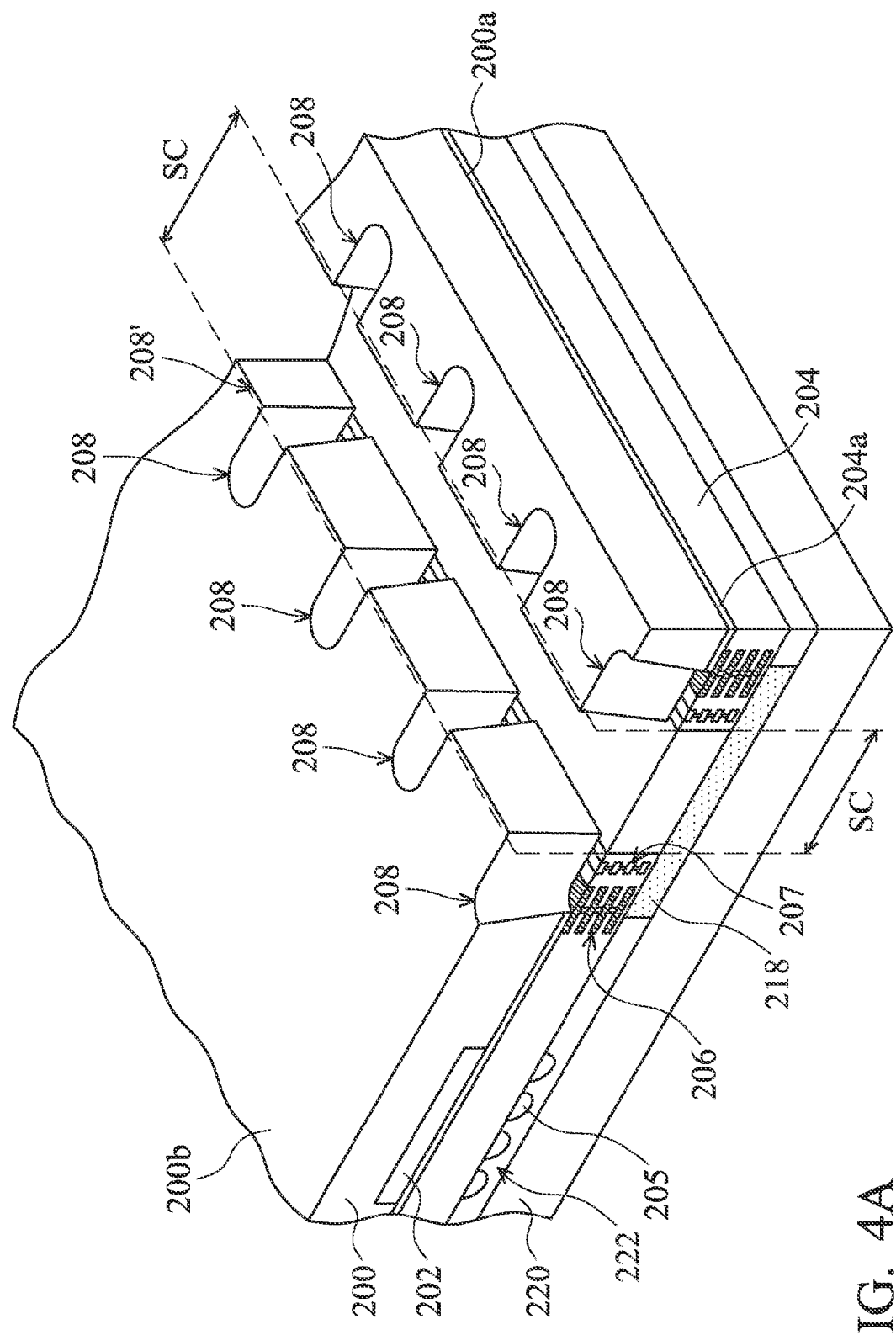
FIGS. 4A-4C are three-dimensional views corresponding to a process of a chip package according to an embodiment of the present invention.
Figure 4B:
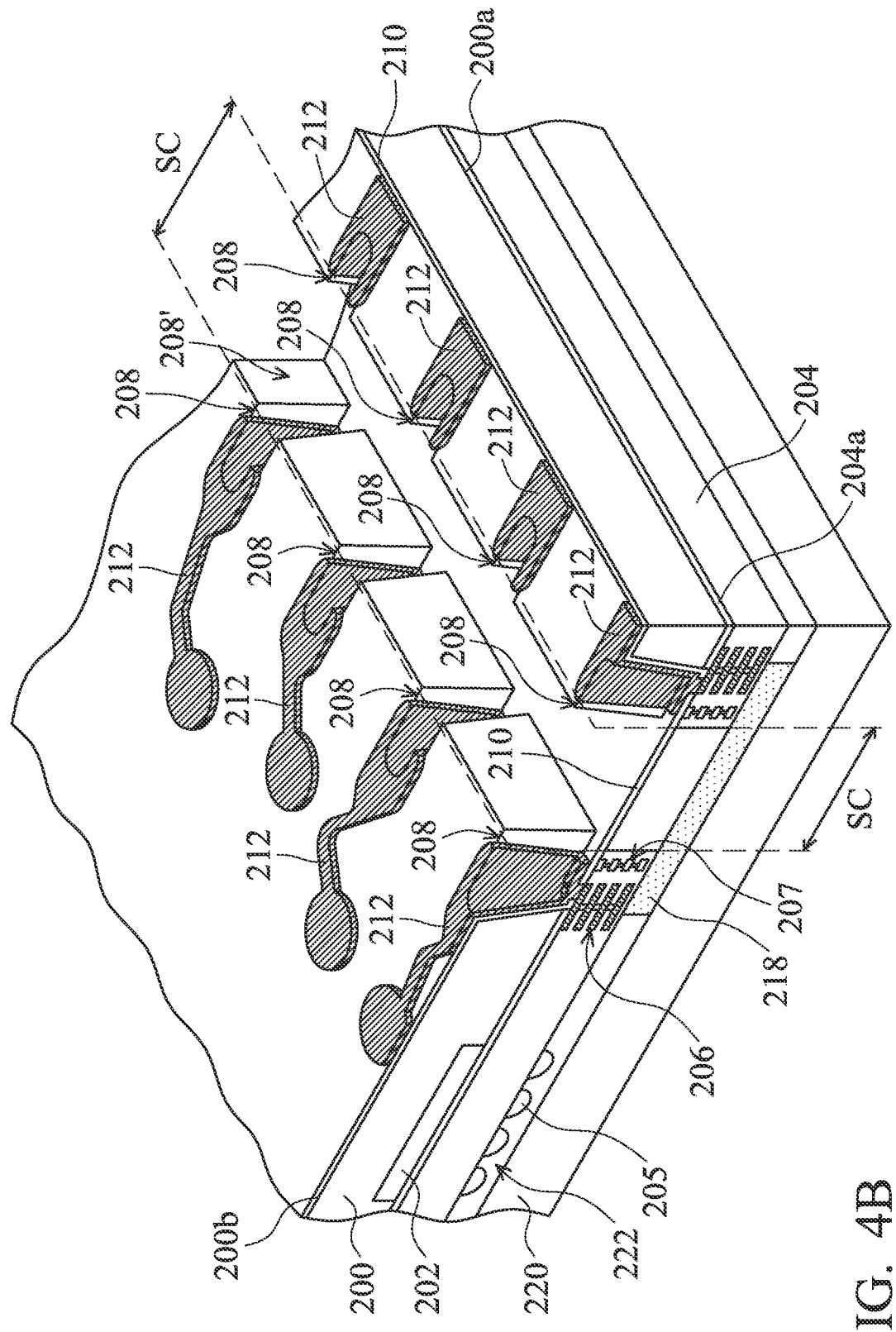
Figure 4C:
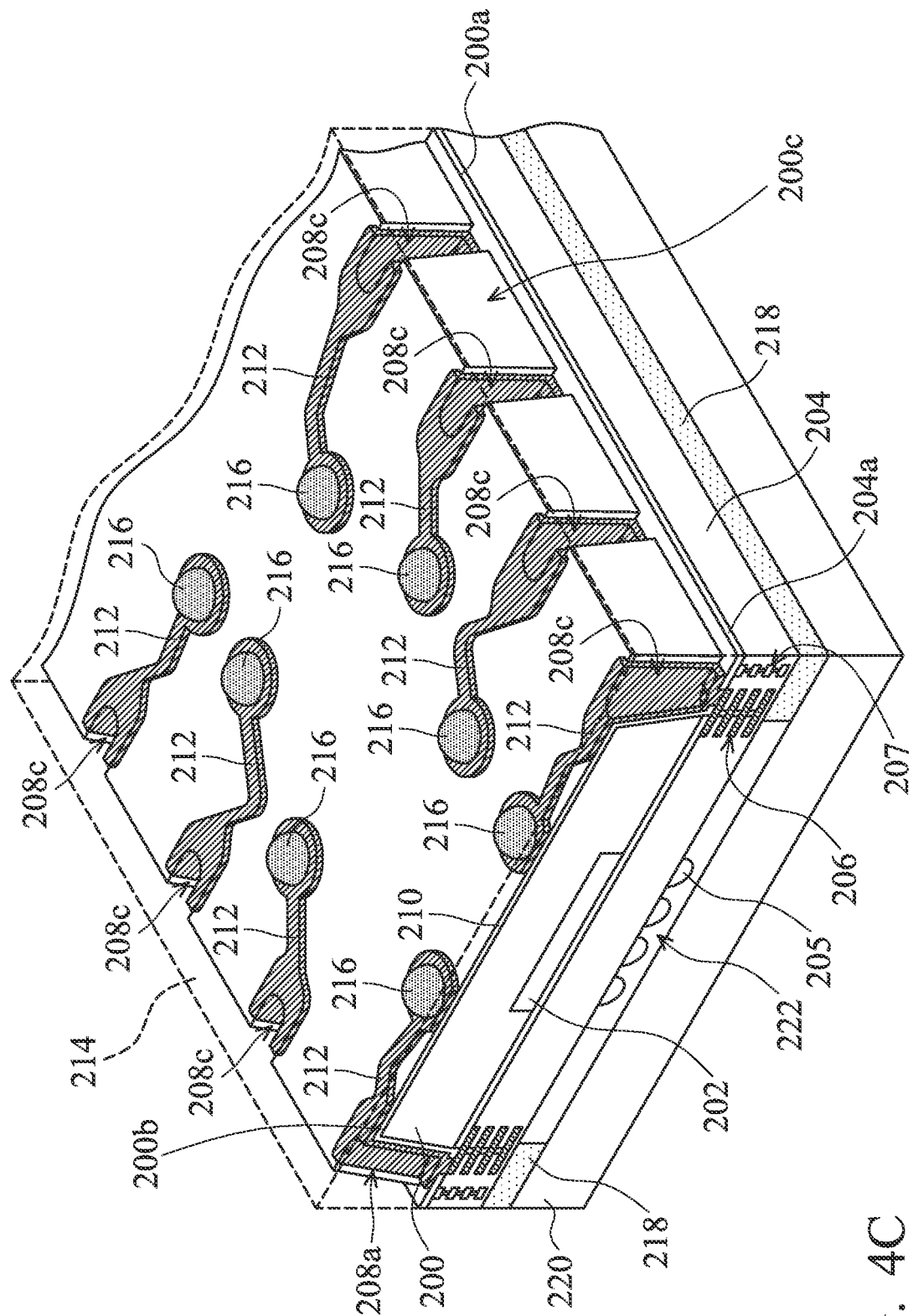
Figure 5A:
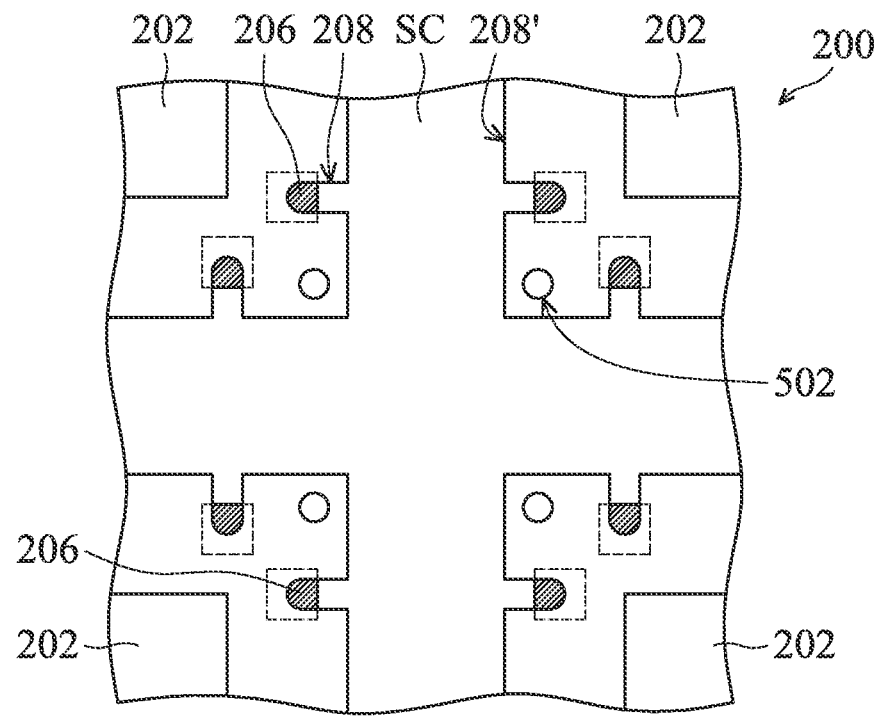
FIGS. 5A-5B are top views of a process of a chip package according to an embodiment of the present invention, and are top views used to illustrate the formation of alignment marks of the embodiment of the present invention.
Figure 5B:
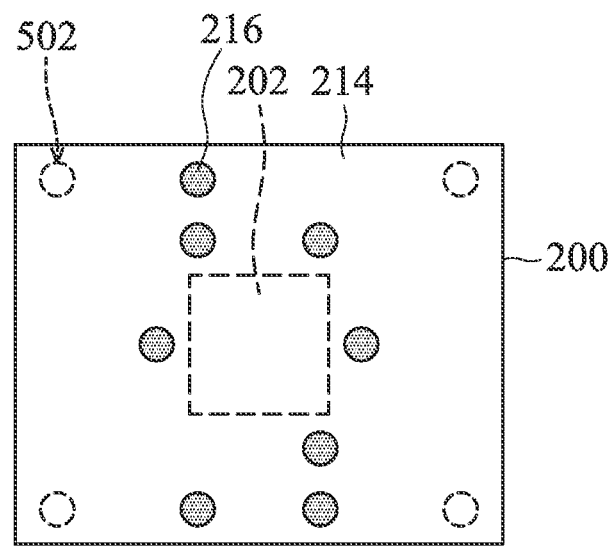

FIGS. 2A-2B are top views of a process of a chip package according to an embodiment of the present invention. FIGS. 3A-3F are cross-sectional views corresponding to the process of the embodiment shown in FIGS. 2A-2B. FIGS. 4A-4C are three-dimensional views corresponding to the process of the embodiment shown in FIGS. 2A-2B. FIGS. 5A-5B are top views of a process of a chip package according to an embodiment of the present invention, and are used to illustrate the formation of alignment marks of the embodiment of the present invention. In the embodiment of FIGS. 2-5, same or similar reference numbers are used to designate same or similar elements.

In one embodiment, the process steps of a chip package include a front-end chip (wafer) process step and a back-end package process step. Through front-end semiconductor processes such as deposition, etching, and development, a variety of integrated circuits may be formed on a wafer. Then, a back-end wafer-level packaging process may be performed to the wafer having integrated circuits formed thereon, followed by a dicing process step to form a plurality of separate chip scale packages.

Figure 3A:
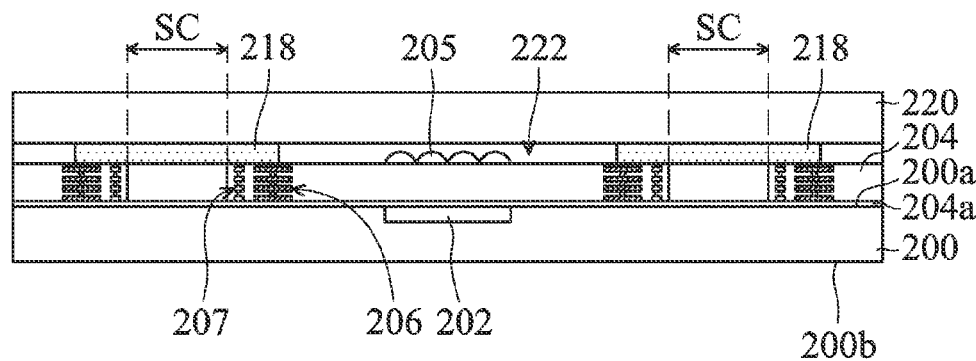
FIGS. 3A-3F are cross-sectional views corresponding to a process of a chip package according to an embodiment of the present invention.

As shown in FIG. 3A, in one embodiment, in the front-end chip process step, a substrate 200 is first provided, which has a surface 200a and a surface 200b. The substrate 200 is, for example, a semiconductor substrate. In one embodiment, the substrate 200 is a semiconductor wafer (such as a silicon wafer). The substrate 200 may be defined into a plurality of die regions by a plurality of predetermined scribe lines SC.

A plurality of device regions 202 may be formed or disposed in the substrate 200. In one embodiment, each of the die regions of the substrate 200 defined by the predetermined scribe lines SC has at least one device region 202, and a plurality of periphery regions respectively and correspondingly surround the device regions 202. The device region 202 may include active or passive devices, or electronic components with digital or analog circuits, such as opto electronic devices, micro electro mechanical systems (MEMS), micro fluidic systems, and physical sensors for detecting heat, light, or pressure, or power MOSFET modules. In the embodiment shown in FIG. 2, the device region 202 may include an optoelectronic device such as an image sensor device or a light emitting device.

As shown in FIG. 2A, at least a dielectric layer may be formed on the surface of the substrate 200 for insulating and covering uses, which may include, for example, a dielectric layer 204a and a dielectric layer 204. A plurality of conducting pads 206 may be formed between the dielectric layer 204 and the substrate 200. The conducting pads 206 may be disposed on, for example, periphery regions of the substrate 200 and be arranged along positions near the predetermined scribe lines SC. The conducting pad 206 may be electrically connected to elements in the device region 202 through an interconnection structure (not shown). In one embodiment, each of the conducting pads 206 may include a stacked structure of a plurality of conducting layers formed in the dielectric layer 204. The stacked conducting layers may be electrically connected to each other through, for example, a metal interconnection structure (not shown).

In one embodiment, the conducting pad 206 is an original conducting pad formed in the dielectric layer 204 in the front-end chip process step and is separated from an edge of the scribe line SC by a predetermined distance. That is, in this embodiment, no conducting pad which is extended to the edge of the scribe line SC or on the scribe line SC needs to be additionally formed. Because all of the conducting pads 206 do not extend into the predetermined scribe lines SC, contact with test structures disposed on the predetermined scribe lines SC may be prevented.

In one embodiment, a plurality of continuous seal ring structures 207 or a plurality of discontinuous seal ring structures 207 may be formed in the dielectric layer 204, which may be respectively disposed on the periphery regions of the die regions of the substrate 200 (or outside regions of the periphery regions) and surround a portion of the periphery region and the device region 202 therein. In one embodiment, the seal ring structures 207 and the conducting pads 206 may be simultaneously defined and formed. Thus, the seal ring structures 207 and the conducting pads 206 may be substantially the same conducting structures. In addition, the seal ring structure 207 may be disposed on a region outside of the conducting pad 206 or on a region surrounded by two adjacent conducting pads 206 and the edge of the scribe line SC. Thus, when a subsequent dicing process is performed along the predetermined scribe lines, the seal ring structure 207 may protect the surrounding devices or circuit structures of the die from being damaged due to stress generated by the dicing process.

After the front-end chip process step is accomplished, a back-end packaging process step may then be performed to the wafer with the integrated circuits formed therein. For optical chips, some auxiliary optical elements may first be disposed. As shown in FIG. 2A, in one embodiment, microlenses 205 may be disposed on the device regions 202, respectively. The microlens 205 may include a microlens array. The microlens 205 may be used to help light to enter the device region 202 or lead light emitted from the device region 202 to the outside. In one embodiment, a color filter plate (not shown) may be optionally disposed on the microlens 205. The color filter plate may be disposed, for example, between the microlens 205 and the device region 202.

Then, a cover layer 220 may be optionally disposed on the surface 200a of the substrate 200. The cover layer 220 may be a substrate such as a glass substrate, quartz substrate, transparent polymer substrate, or combinations thereof. In one embodiment, a spacer layer 218 may be disposed between the cover layer 220 and the substrate 200. The spacer layer 218 may be optionally disposed to partially or completely cover the conducting pad 206 and may further extend across and over the predetermined scribe line SC. The material of the spacer layer 218 may be, for example, a photosensitive polymer material and may be defined and formed through an exposure process and a development process. The spacer layer 218, the cover layer 220 and the substrate 200 may define a substantially closed cavity 222 on the device region 202. The cavity 222 may contain the microlens 205. In one embodiment, the spacer layer 218 may be first formed on the cover layer 220, followed by being bonded onto the dielectric layer 204 on the substrate 200. In one embodiment, the spacer layer 218 still has stickiness and may be directly bonded on the substrate 200. In one embodiment, after the spacer layer 218 is bonded to the substrate 200, a curing process may be performed to the spacer layer 218. For example, the spacer layer 218 may be heated. Alternatively, the spacer layer 218 may be bonded onto the substrate 200 through an adhesive (not shown). In another embodiment, the spacer layer 218 may also be first formed on the substrate 200, and the spacer layer 218 and the cover layer 220 are then bonded.

Then, the substrate 200 may be optionally thinned. For example, the cover layer 220 may be used as a support substrate, and a thinning process may be performed to the surface 200b of the substrate 200 to thin down the substrate 200 to an appropriate thickness. A suitable thinning process may include, for example, a mechanical grinding process, or a chemical mechanical polishing process, an etching process, or combinations thereof.

Figure 3B:
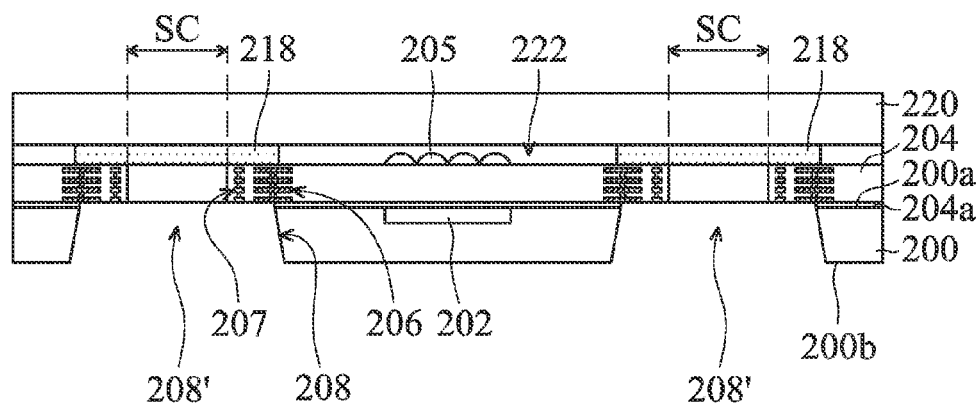

Next, as shown in FIG. 3B, through a photolithography process and an etching process, a portion of the substrate 200 may be removed to form a plurality of openings 208 extending from the surface 200b towards the surface 200a of the substrate 200. Then, a portion of the dielectric layer 204a may be further removed to expose the conducting pads 206. The openings 208 may extend toward the corresponding predetermined scribe lines SC and be across the corresponding conducting pads 206. In one embodiment, the openings 208 may expose the corresponding conducting pads 206 and the seal ring structures 207, respectively.

In one embodiment, by using, for example, a photolithography process and an etching process, a portion of the substrate 200 may be optionally removed to form a plurality of recesses 208' (which is, for example, trenches) extending from the surface 200b towards the surface 200a of the substrate 200. The recesses 208' may be located within the predetermined scribe lines SC. Alternatively, the recesses 208' may overlap with the predetermined scribe lines SC. In one embodiment, the recesses 208' may connect with the openings 208 mentioned above. In one embodiment, the openings 208 and the recesses 208' may be formed in a same patterning process.

FIGS. 2A and 4A are a top view and a three-dimensional view showing the structure corresponding to that shown in FIG. 3B, respectively. As shown in FIGS. 2A and 4A, in one embodiment, the openings 208 respectively extend from the corresponding conducting pads 206 into the corresponding predetermined scribe lines SC to connect with the formed recesses 208' and further extend towards the conducting pads along another side of the predetermined scribe line SC to expose the conducting pads on the other side. That is, the opening 208 may extend across and over the predetermined scribe line SC to connect with the recess 208' and extend to the conducting pad 206 in another die region to expose the conducting pads 206 in two adjacent die regions. In one embodiment, a width of the opening 208 is smaller than or equal to a width of the conducting pad 206. Because the opening 208 extends from the conducting pad 206 into the predetermined scribe line SC to connect with the recess 208' and extends to the conducting pad 206 on the other side, the aspect ratio of the opening (including the opening 208 and the recess 208') is thus reduced, which facilitates subsequent deposition of a variety of material layers in the opening.

Figure 8:
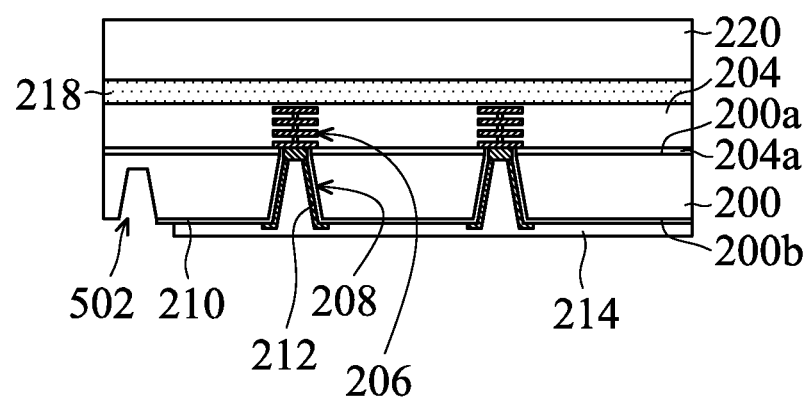
FIG. 8 is a cross-sectional view of the chip package in FIG. 7.

As shown in FIG. 5A, in one embodiment, by using, for example, a photolithography process and an etching process, a portion of the substrate 200 may be optionally removed to form a plurality of alignment marks 502 extending from the surface 200b towards the surface 200a of the substrate 200, as shown in FIG. 8. The alignment marks 502 may be holes or openings formed in the substrate 200. The opening shape of the alignment marks 502 may be a round shape, a rectangular shape, a polygonal shape, an elliptic shape, or other suitable shapes.

The alignment marks 502 are different from the alignment marks 602 shown in FIG. 6. The alignment marks 502 are not located within the predetermined scribe lines SC, but are located in peripheral corner regions of the die region. Thus, even if as shown in FIGS. 2A, 3B and 4A, the substrate 200 within the scribe lines SC are removed to form the recesses 208', the alignment marks 502 still remain, as shown in FIG. 5A. Note that although FIG. 5A shows four alignment marks 502 being adjacent to the crossing predetermined scribing lines SC, the embodiments of the present invention are not limited thereto. In other embodiments, there may be only three or less than three alignment marks 502 adjacent to the crossing predetermined scribing lines SC. The dispositions of the alignment marks 502, which can help subsequent dicing processes to be performed smoothly, are all included in the embodiments of the present invention.

In one embodiment, the alignment marks 502 may be formed after the forming of the openings 208 and the recesses 208'. In another embodiment, the alignment marks 502, the openings 208 and the recesses 208' may be formed in the same patterning process (such as a photolithography process and an etching process) simultaneously. In one embodiment, the alignment mark 502 has a smaller diameter than that of the opening 208. In this case, the depth of the alignment mark 502 is less than that of the opening 208 or that of the recess 208'. For example, the opening 208 may pass through the substrate 200 to expose the conducting pad 206 right under the opening 208. The alignment marks 502 may not pass through the substrate 200 and have less depth. Also, in one embodiment, there is no conducting pad 206 right under the alignment marks 502. In general, the alignment marks 502 may be set in the four corners of the die region. In one embodiment, the alignment marks 502 may be symmetrical to each other. For example, the center line of the predetermined scribing line SC may be a symmetrical center line of the alignment marks 502. That is, one of the predetermined scribing lines SC is a symmetrical center line of the two adjacent alignment marks 502 in the two adjacent die regions of the die regions.

Figure 3C:
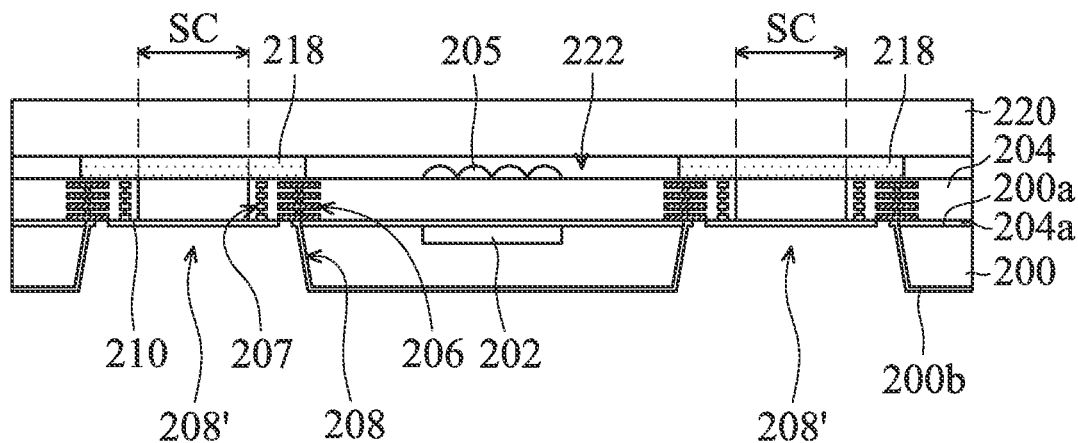

Next, as shown in FIG. 3C, an insulating layer 210 may be formed on the surface 200b of the substrate 200, which may extend into the openings 208. The insulating layer 210 may include, for example, an oxide, nitride, oxynitride, polymer material, or combinations thereof. The insulating layer 210 may be formed by using a chemical vapor deposition process, physical vapor deposition process, thermal oxidation process, or coating process. Then, by using a photolithography process and an etching process, a portion of the insulating layer 210 located on the bottom of the opening 208 may be removed to expose the conducting pad 206. In another embodiment, a photoresist material is adopted to form the insulating layer 210. Thus, an exposure process and a development process may be performed to the insulating layer 210 to pattern the insulating layer 210 such that the conducting pads 206 are exposed. In one embodiment, it is preferable that the insulating layer 210 completely covers the seal ring structures 207 to prevent subsequently formed wiring layers from contacting with the seal ring structures 207 and causing short circuiting.

In one embodiment, there is no insulating layer formed in the alignment marks 502. For example, during the forming of the insulating layer 210, the insulating material may be deposited on sidewalls and/or bottoms of the alignment marks 502. Then, in the patterning process of the insulating layer 210, the insulating material in the alignment marks 502 may also be removed.

Figure 3D:
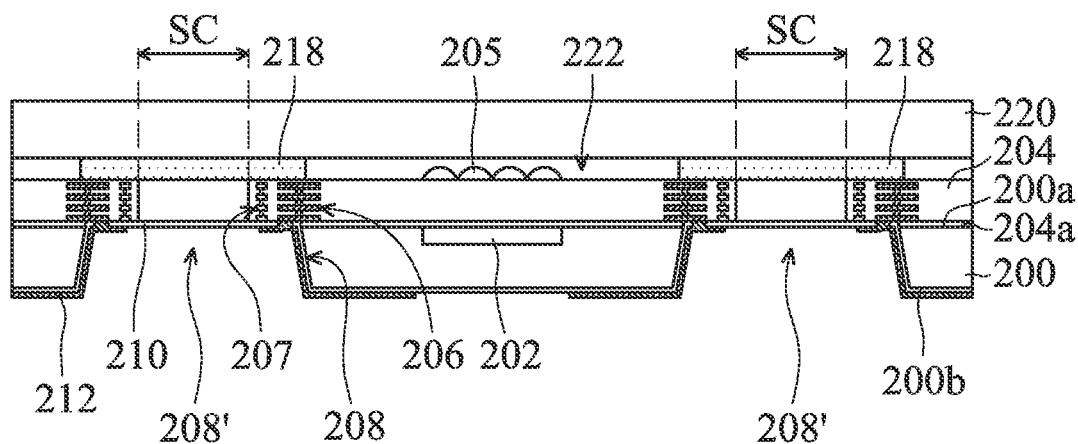

As shown in FIG. 3D, a plurality of wiring layers 212 are then formed on the insulating layer 210 on the surface 200b of the substrate 200. Each of the wiring layers 212 may extend from the surface 200b of the substrate 200 into the corresponding opening 208 to electrically contact with the corresponding conducting pad 206. The material of the wiring layer 212 may be a conducting material such as a metal material or another suitable conducting material. In one embodiment, the material of the wiring layer 212 may be, for example, copper, aluminum, gold, platinum, or combinations thereof. The fabrication method for the wiring layer 212 may include a physical vapor deposition process, chemical vapor deposition process, coating process, electroplating process, electroless plating process, or combinations thereof.

In one embodiment, a conducting layer may be first formed on the insulating layer 210 on the surface 200b of the substrate 200. Then, through a photolithography process and an etching process, the conducting layer is patterned to be the plurality of wiring layers 212. In another embodiment, a seed layer (not shown) may be first formed on the insulating layer 210 on the surface 200b of the substrate 200. Then, a patterned mask layer (not shown) may be formed on the seed layer. The patterned mask layer may have a plurality of openings exposing a portion of the seed layer. Then, through an electroplating process, a conducting material may be electroplated onto the seed layer exposed by the openings of the patterned mask layer. Then, the patterned mask layer may be removed, and the seed layer originally covered by the patterned mask layer may be removed by using an etching process such that the formation of the wiring layers 212 is accomplished.

FIG. 4B is a three-dimensional view showing the structure corresponding to the structure shown in FIG. 3D. As shown in FIGS. 3D and 4B, the plurality of wiring layers 212 extend from positions on the insulating layer 210 on the surface 200b of the substrate 200 into the openings 208, respectively and correspondingly, to electrically contact with the corresponding conducting pads 206 below the corresponding openings 208. In one embodiment, each of the wiring layers 212 does not extend into the predetermined scribe lines SC or is separated from the predetermined scribe line SC by a distance. Thus, when a dicing process is subsequently performed along the predetermined scribe lines SC, a cutting blade is not in contact with the wiring layers 212 to cause damage or peeling of the wiring layers 212. In addition, the wiring layers 212 are separated from the seal ring structures 207 by the insulating layer 210 such that no short circuiting forms between the wiring layers 212. In the present embodiment, because the openings 208 are across the predetermined scribing line SC and connect to the recess 208', the openings 208 have larger diameters. Thus, it is easier to form insulating layers and/or wiring layers in the openings Similarly, in one embodiment, there is no wiring layer formed in the alignment marks 502. For example, during the forming of the wiring layers 212, the conducting material may be deposited on the sidewalls and/or bottoms of the alignment marks 502. Then, in the patterning process of the wiring layers 212, the conducting material in the alignment marks 502 may also be removed. Therefore, in one embodiment, there is no metal material contained in the alignment marks 502.

Figure 3E:
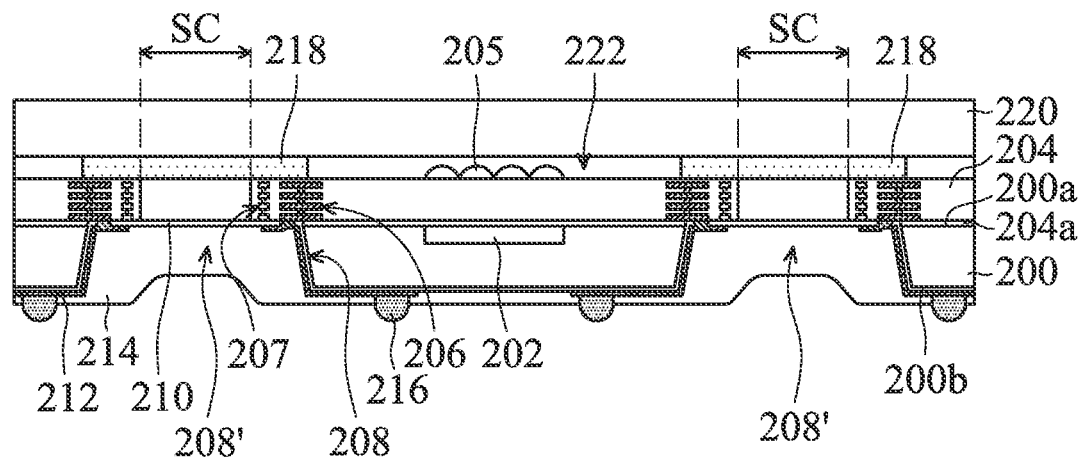

Next, as shown in FIG. 3E, a protection layer 214 is formed on the surface 200b of the substrate 200. The protection layer 214 may include a solder mask material, green paint, polyimide, or another suitable insulating material. The protection layer 214 may be formed by using, for example, a coating process or a spray coating process. The protection layer 214 may cover the substrate 200, the wiring layers 212, the openings 208, and the recesses 208'. Then, the protection layer 214 may be patterned to have openings exposing a portion of the wiring layers 212. In one embodiment, through a patterning process of the protection layer 214, the protection layer 214 is set to not extend into the predetermined scribe lines SC (not shown). In one embodiment, the protection layer 214 may not cover the alignment marks 502. In another embodiment, because the protection layer 214 is thin, the protection layer 214 may cover the alignment marks 502. In this case, an observer can recognize the alignment marks 502 under the protection layer 214. In one embodiment, the protection layer 214 may be partially filled into the alignment marks 502. In another embodiment, the protection layer 214 may not be filled into the alignment marks 502.

Then, conducting bumps 216 may be formed on the exposed wiring layers 212, which may be, for example, solder balls. In one embodiment, under bump metallurgy layers (not shown) may be first formed on the exposed wiring layers 212 to facilitate the formation of the conducting bumps 216.

Figure 3F:
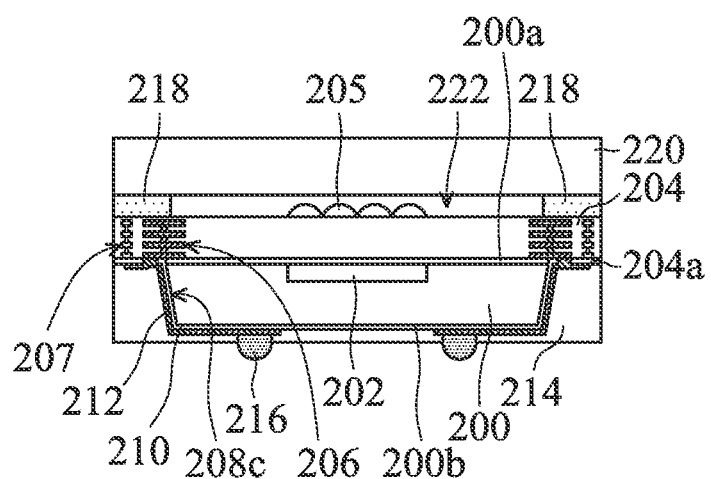

Next, by the assistance of the alignment marks 502, a dicing process may be accurately performed along the predetermined scribe lines SC to form a plurality of chip packages separated from each other. FIG. 3F is a cross-sectional view showing one of the chip packages, and FIGS. 2B and 4C respectively show a top view and a three-dimensional view of the structure corresponding to the structure shown in FIG. 3F. After the dicing process is performed, a portion of the opening 208 becomes the opening 208c located at a side surface 200c of the substrate of the chip package, as shown in FIG. 2B or FIG. 4C.

In one embodiment, the openings 208c expose the corresponding conducting pads 206, and extend along a direction across the side surface 200c of the substrate 200 toward the side surface 200c of the substrate 200, and cross through the conducting pads 206. In one embodiment, the openings 208c extend to the side surface 200c of the substrate 200, as shown in FIG. 4C.

FIG. 5B is a top view of a chip package, and FIG. 5B is used to illustrate the location of the alignment marks 502. For clearly showing the alignment marks 502, the openings 208c, the insulating layer 210 therein and the wiring layers 212 in the openings 208c are not shown in FIG. 5B. As shown in FIG. 5B, the alignment marks 502 used for alignment may be located in the peripheral corner regions of the substrate 200 of the chip package. In general, the alignment marks 502 may be formed in the substrate 200 and be located in four peripheral corner regions of the substrate 200 of the chip package, but the present invention is not limited thereto. In other embodiments, the alignment marks 502 may be located in only two, three or one peripheral corner region(s) of the substrate 200 of the chip package. In one embodiment, the chip package has a plurality of alignment marks 502, and the alignment marks 502 may be symmetrical to each other. For example, the center point of the substrate 200 of the chip package may be a symmetrical center of the alignment marks 502. That is, the alignment marks 502 are symmetrical to each other relative to a center point of the substrate 200. In one embodiment, a line, which passes through the two alignment marks 502 adjacent to a side of the substrate 200 of the chip package, may be substantially parallel to the side of the substrate 200 of the chip package.

Figure 7:
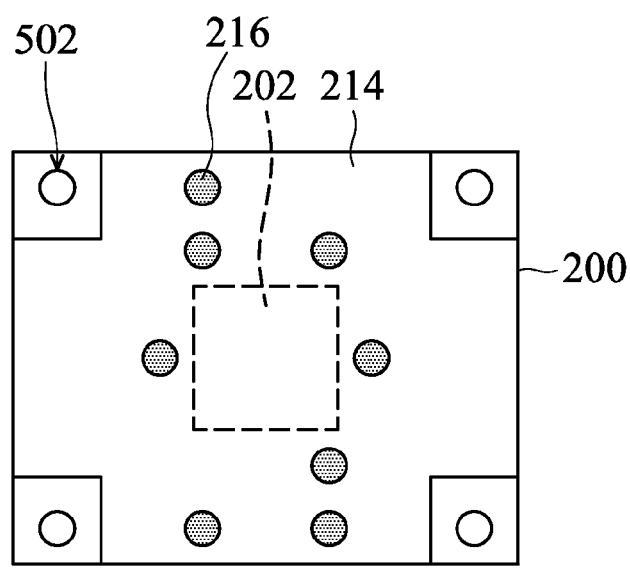
FIG. 7 is a top view of a chip package according to an embodiment of the present invention.

Unlike conventional alignment marks formed in chips in a front-end chip process, wherein the conventional alignment marks extend from the surface 200a toward the surface 200b of the substrate 200, the alignment marks 502 of the embodiment of the present invention extend from the surface 200b toward the surface 200a of the substrate 200 because the alignment marks 502 are formed in a back-end package process. In one embodiment, there is no insulating material or no metal material in the alignment marks 502. Also, there is no conductive pad 206 right under the alignment marks 502. Furthermore, the protection layer 214 may cover the alignment marks 502. In another embodiment, the protection layer 214 may not cover the alignment marks 502 by using a patterning process, as shown in FIG. 7.

Depending on requirements, the alignment marks 502 of the embodiments of the present invention are not only used in the embodiments described above but also the embodiments (i.e. TSV) shown in FIGS. 1A-1B.

The packaging technique of the embodiments of the present invention may effectively reduce the process difficulty of forming the wiring layer, which is electrically connected to the conducting pad in the chip package. The embodiments of the present invention adopt a wafer level package. The set of the alignment marks in the die region may ensure that subsequent dicing processes may be performed accurately and smoothly. Note that as the density of the dies of the wafer is increased, the predetermined widths of the predetermined scribing lines may be reduced. In this case, by using the alignment marks of the embodiments of the present invention, the wafer level dicing process may be performed more accurately, which ensures the reliability and the quality of formed chip packages.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A chip package, comprising:
   a semiconductor substrate having a first surface, a second surface opposite thereto, and a side surface extending between the first surface and the second surface;
   a device region located in the semiconductor substrate;
   a dielectric layer disposed on the first surface of the semiconductor substrate;
   a plurality of conducting pads disposed in the dielectric layer and electrically connected to the device region;
   a plurality of openings extending from the second surface toward the first surface of the semiconductor substrate, and respectively exposing the corresponding conducting pads, wherein the openings extend toward the side surface of the semiconductor substrate and are across the corresponding conducting pads respectively; and
   at least one alignment mark disposed in the semiconductor substrate and extending from the second surface toward the first surface.

2. The chip package as claimed in claim 1, wherein the at least one alignment mark is located in a peripheral corner region of the semiconductor substrate.

3. The chip package as claimed in claim 1, further comprising:
   a plurality of wiring layers disposed on the second surface of the semiconductor substrate, and respectively and correspondingly extending into the openings to electrically contact the conducting pads; and an insulating layer disposed between the semiconductor substrate and the wiring layers.

4. The chip package as claimed in claim 3, wherein the openings connect to the side surface of the semiconductor substrate, respectively.

5. The chip package as claimed in claim 3, wherein there are no wiring layers and no insulating layer in the at least one alignment mark.

6. The chip package as claimed in claim 3, wherein a depth of the at least one alignment mark is less than a depth of one of the openings.

7. The chip package as claimed in claim 1, further comprising:

a protection layer covering the semiconductor substrate, wherein the protection layer covers the at least one alignment mark.

8. The chip package as claimed in claim 7, wherein the protection layer partially fills the at least one alignment mark.

9. The chip package as claimed in claim 1, further comprising:

a protection layer covering the semiconductor substrate, wherein the protection layer does not cover the at least one alignment mark.

10. The chip package as claimed in claim 1, wherein the at least one alignment mark comprises a plurality of alignment marks.

11. The chip package as claimed in claim 10, wherein a line, which passes through at least two alignment marks adjacent to a side of the semiconductor substrate, is substantially parallel to the side of the semiconductor substrate.

12. The chip package as claimed in claim 10, wherein the alignment marks are symmetrical to each other relative to a center point of the semiconductor substrate.

13. The chip package as claimed in claim 1, wherein there is no conducting pad right under the at least one alignment mark.

14. A method for forming a chip package, comprising:

providing a semiconductor substrate having a first surface and a second surface opposite thereto, wherein the semiconductor substrate is divided into a plurality of die regions by a plurality of predetermined scribing lines;

forming a device region located in each of the die regions in the semiconductor substrate;

forming a dielectric layer disposed on the first surface of the semiconductor substrate;

forming a plurality of conducting pads disposed in the dielectric layer and electrically connected to the device region for each of the die regions, wherein the conducting pads are arranged substantially along the predetermined scribing lines;

forming a plurality of openings extending from the second surface toward the first surface of the semiconductor substrate, and respectively exposing the corresponding conducting pads;

forming a plurality of alignment marks disposed in the semiconductor substrate and extending from the second surface toward the first surface, wherein at least one of the alignment marks is formed in each of the die regions of the semiconductor substrate; and using the alignment marks, performing a dicing process along the predetermined scribing lines to form a plurality of chip packages separated from each other, wherein a side surface of the semiconductor substrate is formed from the dicing process and extending between the first surface and the second surface of the semiconductor substrate, and wherein the openings extend toward the side surface of the semiconductor substrate and are across the corresponding conducting pads respectively.

15. The method for forming the chip package as claimed in claim 14, further comprising:

after forming the openings in the semiconductor substrate, forming an insulating layer on the second surface of the semiconductor substrate;

removing a portion of the insulating layer to expose the conducting pads; and forming a plurality of wiring layers on the insulating layer, wherein the wiring layers extend into the corresponding openings to electrically contact the corresponding conducting pads.

16. The method for forming the chip package as claimed in claim 15, further comprising:

partially removing the semiconductor substrate from the second surface of the substrate to form a plurality of recesses extending toward the first surface, wherein the recesses are in the substrate and are located within the predetermined scribing lines and are connected to the openings.

17. The method for forming the chip package as claimed in claim 16, wherein the alignment marks, the openings, and the recesses are formed in the same patterning process simultaneously.

18. The method for forming the chip package as claimed in claim 14, further comprising:

forming a protection layer on the substrate and the wiring layers, wherein the protection layer covers the alignment marks.

19. The method for forming the chip package as claimed in claim 14, further comprising:

forming a protection layer on the substrate and the wiring layers, wherein the protection layer does not cover the alignment marks.

20. The method for forming the chip package as claimed in claim 14, wherein one of the predetermined scribing lines is a symmetrical center line of adjacent two of the alignment marks in adjacent two of the die regions.

* * * * *